(12) United States Patent
Raimann et al.

(10) Patent No.: US 11,626,813 B2
(45) Date of Patent: Apr. 11, 2023

(54) HALF-BRIDGE MODULE OF A TRACTION INVERTER OF POWER ELECTRONICS OF AN ELECTRIC OR HYBRID VEHICLE

(71) Applicant: ZF Friedrichshafen AG, Friedrichshafen (DE)

(72) Inventors: Manuel Raimann, Überlingen (DE); Michael Kohr, Bodnegg (DE); Marcus Berner, Oggelshausen (DE)

(73) Assignee: ZF Friedrichshafen AG, Friedrichshafen (DE)

(*) Notice: Subject to any disclaimer, the term of this patent is extended or adjusted under 35 U.S.C. 154(b) by 36 days.

(21) Appl. No.: 17/124,195

(22) Filed: Dec. 16, 2020

(65) Prior Publication Data
US 2021/0194385 A1 Jun. 24, 2021

(30) Foreign Application Priority Data
Dec. 18, 2019 (DE) ...................... 10 2019 220 010.9

(51) Int. Cl.
*H05K 1/18* (2006.01)
*H02M 7/5387* (2007.01)
(Continued)

(52) U.S. Cl.
CPC ....... *H02M 7/53875* (2013.01); *B60L 15/007* (2013.01); *H01L 23/3735* (2013.01);
(Continued)

(58) Field of Classification Search
CPC ............. H05K 1/18; H05K 1/181–187; H01L 23/049; H01L 23/3735; H01L 23/49541;
(Continued)

(56) References Cited

U.S. PATENT DOCUMENTS

| 6,933,593 B2 * | 8/2005 | Fissore | ............. H01L 23/49861 257/691 |
| 2002/0118560 A1 * | 8/2002 | Ahmed | ................... H01L 23/66 257/E25.016 |

(Continued)

FOREIGN PATENT DOCUMENTS

DE       10 2008 049 193 A1     1/2011

OTHER PUBLICATIONS

German Office Action issued in corresponding DE Application No. 10 2019 220 0109 created on Jul. 21, 2020 (10 pages).

*Primary Examiner* — Tuan T Dinh
(74) *Attorney, Agent, or Firm* — Crowell & Moring LLP

(57) ABSTRACT

The invention relates to a half bridge module in a traction inverter for a power electronics unit in an electric or hybrid vehicle, comprising a substrate, semiconductor switching elements on a first side of the substrate, power connections, to which power lines that conduct electrical traction energy are connected, signal connections, to which signal lines are connected for switching the semiconductor switching elements, and a casting compound, which encompasses the substrate and the semiconductor switching elements on the first side of the substrate, wherein the power connections and the signal connections are accessed from the first side of the substrate, such that the power connections and the signal connections extend through the casting compound, seen from the first side of the substrate, and are located within a base area spanning the substrate, seen from the direction they pass through the casting compound.

12 Claims, 3 Drawing Sheets

(51) Int. Cl.
*B60L 15/00* (2006.01)
*H02M 1/096* (2006.01)
*H01L 23/373* (2006.01)

(52) U.S. Cl.
CPC ......... *H02M 1/096* (2013.01); *B60L 2210/40* (2013.01); *H05K 1/181* (2013.01)

(58) Field of Classification Search
CPC ......... H01L 23/49548; H01L 23/49861; H01L 23/49805; H02M 1/098; H02M 1/327; H02M 7/53871–53875
USPC ............. 361/775–784, 803, 813; 439/61, 65, 439/76.2; 257/690–695
See application file for complete search history.

(56) References Cited

U.S. PATENT DOCUMENTS

| | | | |
|---|---|---|---|
| 2007/0165376 A1* | 7/2007 | Bones | H01L 25/162 |
| | | | 257/E25.031 |
| 2010/0065962 A1* | 3/2010 | Bayerer | H01L 24/49 |
| | | | 257/E23.009 |
| 2013/0105961 A1* | 5/2013 | Jones | H01L 23/049 |
| | | | 257/E23.079 |
| 2016/0190915 A1* | 6/2016 | Horiuchi | H02H 7/122 |
| | | | 363/132 |
| 2018/0114740 A1 | 4/2018 | Liu et al. | |
| 2018/0278172 A1* | 9/2018 | Tokuyama | H01L 23/49541 |
| 2019/0067160 A1* | 2/2019 | Xu | H01L 23/3735 |
| 2019/0181770 A1* | 6/2019 | Martin | H05K 1/181 |
| 2019/0237439 A1* | 8/2019 | McPherson | H01L 23/5386 |

\* cited by examiner

HALF-BRIDGE MODULE OF A TRACTION INVERTER OF POWER ELECTRONICS OF AN ELECTRIC OR HYBRID VEHICLE

CROSS-REFERENCE TO RELATED APPLICATIONS

This application claims priority from German Application No. DE 10 2019 220 010.9, filed on Dec. 18, 2019, the entirety of which is hereby fully incorporated by reference herein.

The invention relates to a half bridge module in a traction inverter for power electronics in an electric or hybrid vehicle.

Electric vehicles and hybrid vehicles use electric machines as drive units. To supply the electric machines in these electric vehicles and hybrid vehicles with traction electricity, the electric vehicles and hybrid vehicles also comprise electric energy storage units, referred to as traction batteries. The traction batteries are DC batteries, but the electric machines require AC power. For this reason, a power electronics unit with a traction inverter are incorporated between a traction battery and an electric machine in an electric or hybrid vehicle. Inverters are also referred to as power inverters.

Traction inverters in a power electronics unit in an electric or hybrid vehicle comprise semiconductor switching elements typically made of transistors. These semiconductor switching elements can be provided in different degrees of integration, either as discrete switches with a low degree of integration but higher scalability, as bridge modules with a high degree of integration but lower scalability, or as half bridge modules lying between individual switches and bridge modules in terms of the degree of integration and the scalability. All of the prior known embodiments have in common that they display a relatively high inductance in the range of tens of nHs (nanohenrys) as a result of leakage inductance in the commutation cell. This results in voltage surges, or higher switching losses when switching the power semiconductor. Furthermore, long signal connections with higher inductances result in poorer switching or gate control in the power semiconductor.

There is a need for a novel half bridge module in a traction inverter for a power electronics unit in an electric or hybrid vehicle, which can be readily scaled, and, because of its degree of integration, is easy to assemble, and which has a lower inductance in the commutation cell and the signal connections, in order to keep electrical losses as low as possible when switching.

US 2018/0114740 A1 discloses an inverter for power electronics in an electric or hybrid vehicle that has a low degree of integration, in the form of individual switches. A bipolar transistor is placed on a substrate, which is at least partially encompassed in a casting compound. The substrate is attached to a housing via a sinter layer.

Based on this, the fundamental object of the invention is to create a novel half bridge module for a traction inverter in a power electronics unit in an electric or hybrid vehicle.

This object is achieved by a half bridge module according to claim 1.

The half bridge module according to the invention has a substrate. The half bridge module according to the invention also has semiconductor switching elements on a first side of the substrate. The half bridge module according to the invention also has a casting compound encompassing the substrate and the semiconductor elements on the first side of the substrate.

The half bridge module according to the invention also has power connections, to which power lines conducting electrical traction energy can be connected. The half bridge module according to the invention also has signal connections, to which signal lines can be connected for switching the semiconductor switching elements.

The power connections and the signal connections in the half bridge module according to the invention can all be accessed from the first side of the substrate such that the power connections and the signal connections extend through the casting compound from the first side of the substrate, and are located within a base area spanning the substrate, seen in the direction it passes through the casting compound.

The substrate can be a DBC (direct bonded copper) substrate, an AMB (active metal brazing) substrate, or an IM (insulated metal) substrate.

The half bridge module according to the invention has a certain degree of integration, and it can be readily scaled. It therefore combines the advantages of discrete structures comprising individual switches with the advantages of highly integrated power modules. All of the power connections and signal connections extend through the casting compound, and are located within the base area spanning the substrate, viewed in the direction they pass through the casting compound. This makes it possible to orient the power connections in relation to one another such that the half bridge module ultimately exhibits low leakage inductance in the commutation cell on the order of a few nanohenrys, and low leakage inductances in the signal connections. Both contribute to low loss switching.

Another advantage of this embodiment of the power connections and signal connections is that they no longer extend to the side, such that they are located outside the base area spanning the substrate. This results in advantages regarding structural space.

Another advantage is obtained through the large possible electric insulation distances (leakage distances) for the connections as a result of their being placed on the upper surface, without significantly increasing the leakage inductance in the commutation cell.

According to an advantageous development of the invention, the power connections comprise positive connections, negative connections, and phase connections. The phase connections are adjacent to a first edge of the substrate, seen in the direction in which they pass through the casting compound, and the negative connections are adjacent to a second edge of the substrate, lying opposite the first edge, seen in the direction in which they pass through the casting compound. The positive connections are located between the phase connections and the negative connections, at a distance thereto, seen in the direction in which they pass through the casting compound. The positive connections are in contact with a first, laminar busbar, and the negative connections are in contact with a second, laminar busbar, wherein the first and second busbars are arranged one above the other, and wherein insulation is preferably located between the first and second busbars. This development results in a further reduction of the leakage inductances in the half bridge module. This also results in a super-low inductance commutation cell. Electrical losses can be reduced to a minimum.

According to an advantageous development of the invention, first signal connections for a first semiconductor switching element are located between the phase connections and the positive connections, at a distance thereto, seen in the direction they pass through the casting compound.

Second signal connections for a second semiconductor switching element are located between the positive connections and the negative connections, at a distance thereto, seen in the direction they pass through the casting compound. This results in further advantages regarding structural space.

All of the power connections and signal connections can be positioned in the immediate proximity of the semiconductor switching elements, at appropriate locations. As a result, there is no need for long connection paths between the power connections or signal connections and the semiconductor switching elements.

According to an advantageous development of the invention, a cooling unit is bonded to the half bridge module, wherein this bond is formed by a sinter connection, solder connection, or thermal adhesive. This results in a substantially optimized thermal conductance from the half bridge module to the cooling unit.

The invention also relates to a traction inverter for a power electronics unit in an electric or hybrid vehicle, comprising at least two half bridge modules according to the invention.

Preferred developments can be derived from the dependent claims and the following description.

Exemplary embodiments of the invention shall be explained in greater detail in reference to the drawings, without being limited thereto. Therein:

Figure 1:
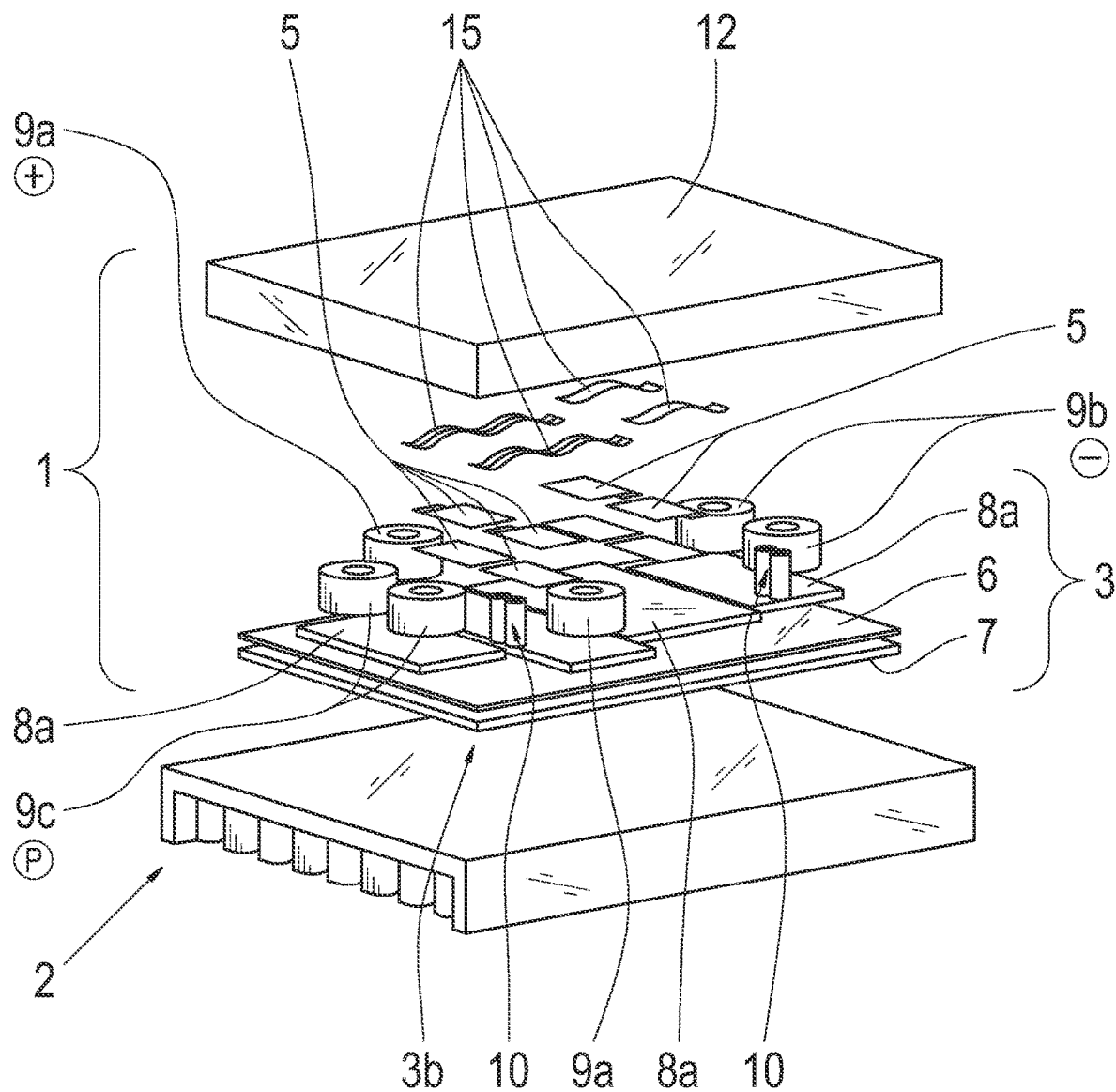
FIG. 1 shows an exploded view of a half bridge module according to the invention, without busbars, together with an external cooling unit.

FIGS. 1 to 4 show different views of a half bridge module 1 according to the invention for a traction inverter in a power electronics unit for an electric or hybrid vehicle, wherein the half bridge module is shown together with a cooling unit 2 in FIGS. 1 to 4, to which the half bridge module 1 according to the invention can be connected.

The half bridge module 1 has a substrate 3, and semiconductor switching elements 4 located on a first side 3a of the substrate 3. The semiconductor switching elements 4 are made up of semiconductor modules 5 in the form of transistors.

The substrate 3 is a DBC (direct bonded copper) substrate, for example, which has a ceramic carrier plate 6, for example, which is coated on both sides with copper layers 7, 8.

The copper layer 8 is formed by numerous separate sections 8a on the first side 3a of the substrate 3. The semiconductor switching elements 4, as well as other elements, are placed on these sections 8a.

The copper layer 7 formed on the opposite side 3b of the substrate 3 is structured and therefore does not cover the entire ceramic carrier 6.

In addition to the substrate 3 and the semiconductor switching elements 4, the half bridge module 1 according to the invention comprises power connections 9 and signal connections 10.

The power connections 9 are connected to power lines in the form of busbars 11, which conduct electricity. The signal connections 10 are connected to signal lines to control the switching states of the semiconductor switching elements 4, and to switch them accordingly.

Figure 3:
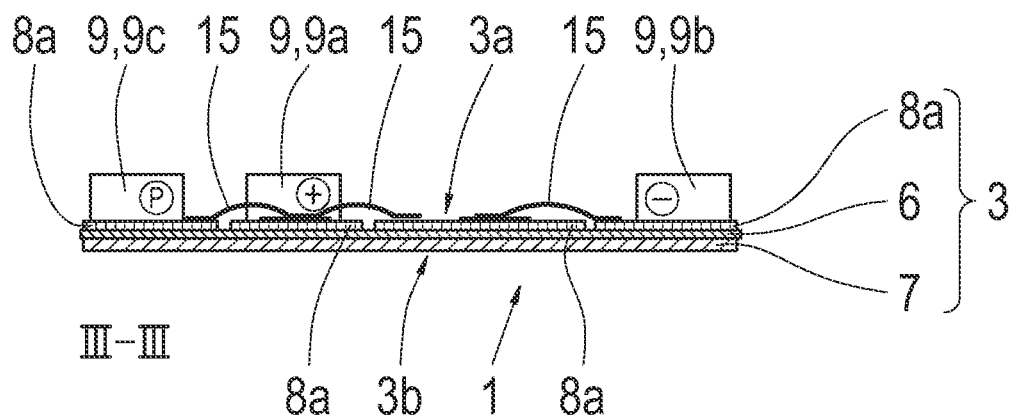
FIG. 3 shows a cross section through FIG. 2, cut along the line III-III.
Figure 4:
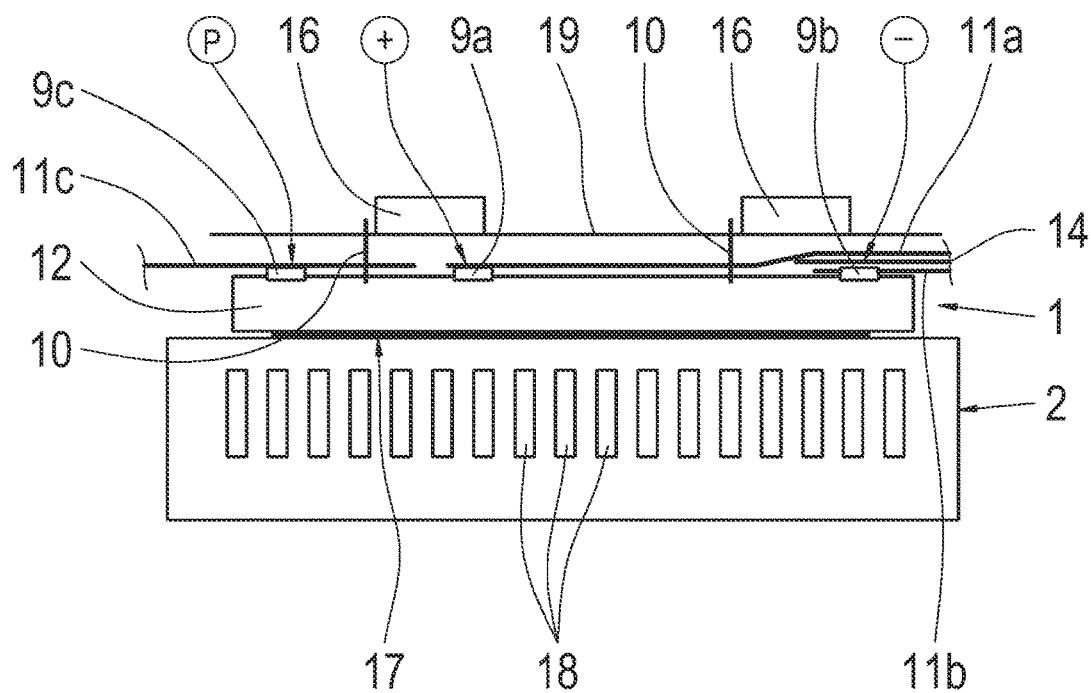
FIG. 4 shows a side view of the half bridge module according to the invention, together with the external cooling unit and an external printed circuit board.

Power lines in the form of busbars 11 are shown in FIG. 4, which are connected to the power connections 9. FIG. 4 also shows a printed circuit board 19, which has signal lines that are connected to the signal connections 10 in the half bridge module 1. The power lines 11 and the printed circuit board are not shown in FIGS. 1, 2, and 3.

The half bridge module 1 according to the invention also comprises a casting compound 12, made of plastic, in particular. The casting compound 12 encompasses the substrate 3 and the semiconductor switching elements 4 on the first side 3a of the substrate 3.

The power connections 9 and the signal connections 10 can all be accessed on this first side 3a of the substrate 3, wherein the power connections 9 and the signal connections 10 extend through the casting compound 12, seen from the first side of the 3a of the substrate 3, and are located within a base area spanning the substrate 3, seen from the direction they pass through the casting compound 12. This base area of the substrate 3 is visible in FIG. 2 in particular, and is bordered by edges 13 of the substrate 3.

All of the power connections 9 and signal connections 10 extend upward, seen in the cross section in FIG. 3, without protruding over the base area spanning the substrate 3, which is bordered by the edges 13.

Figure 2:
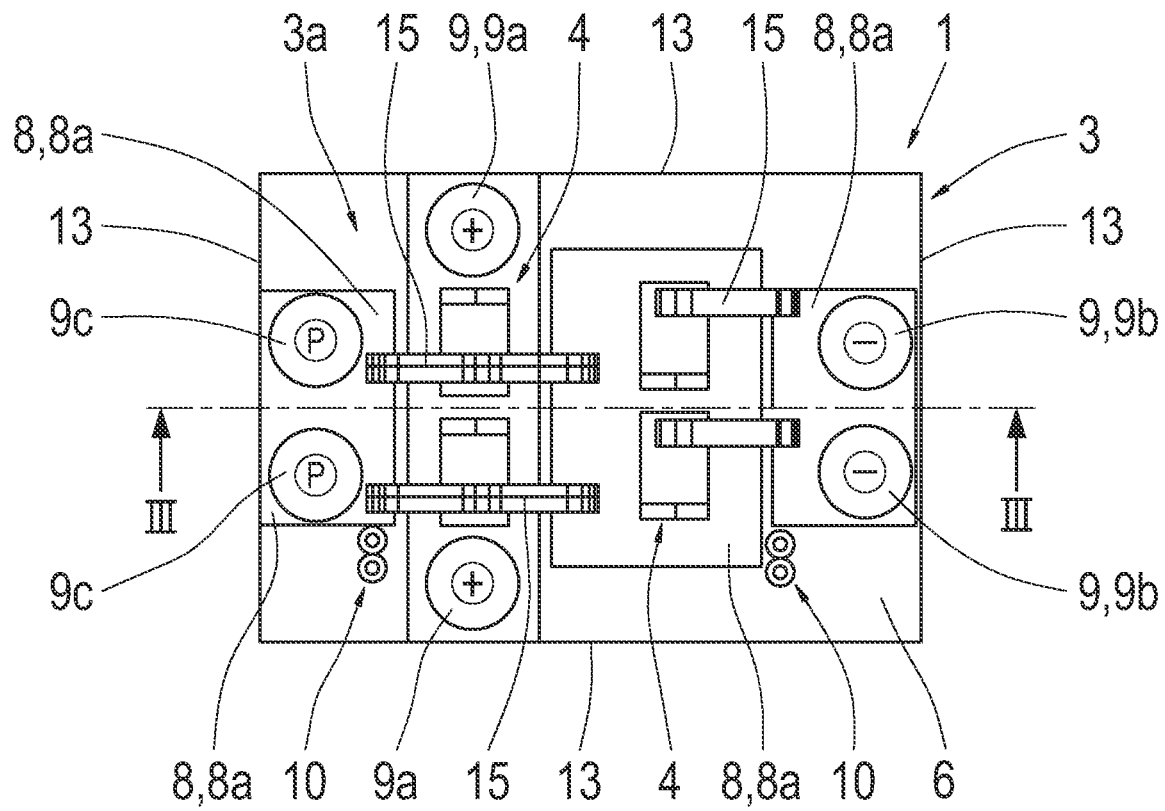
FIG. 2 shows a top view of the half bridge module according to the invention, without casting compound.

As can be best derived from FIGS. 2 and 3, the power connections 9 comprise positive connections 9a, negative connections 9b, and phase connections 9c. The positive connections 9a in the power connections 9 have a plus sign, and the negative connections 9b have a minus sign, and the phase connections 9c have a P in FIGS. 2 and 3. Seen in the direction the power connections pass through the casting compound 12, the phase connections 9c are adjacent to a first edge 13 of the substrate, and the negative connections 9b are adjacent to a second edge 13 of the substrate 3, lying opposite the first edge 13. These two edges 13 form the narrow sides of the substrate 3. The edges 13 extending between these edges 13 form the long sides of the substrate 3. The positive connections 9a in the power connections 9 in the half bridge module 1 according to the invention are located between the phase connections 9c and the negative connections 9b, at a distance thereto, seen in the direction they pass through the casting compound 12. It can be derived from FIGS. 2 and 3 that the distance between the positive connections 9a and the phase connections 9c is less than the distance between the positive connections 9a and the negative connections 9b.

As explained above, the power connections 9 are connected to power lines in the form of busbars 11. According to FIG. 4, the two positive connections 9a are in contact with the same first laminar busbar 11a, the negative connections 9b are in contact with the same second laminar busbar 11b, and the phase connections 9c are in contact with the same third laminar busbar 11c.

The first laminar busbar 11a for the two positive connections 9a and the second laminar busbar 11b for the two negative connections 9b extend outward over the second edge 13 of the substrate 3, wherein these two busbars 11a, 11 b for the positive connections 9a and the negative connections 9b run one above the other in sections, with insulation 14 placed therebetween.

The third laminar busbar 11c, with which the two phase connections 9c are in contact, extends outward over the first edge 13 of the substrate 3.

Leakage inductances can be minimized by the above layout of the power connections 9 and signal connections 10, in particular in combination with the arrangement thereof and the design and arrangement of the busbars 11, such that a low-inductance half bridge module can be obtained with inductances in the commutation cell on the order of only a few nanohenrys. This also results in advantages regarding structural space, because all of the power connections 9 and signal connections 10 are located within the base area of the substrate 3.

As can best be derived from FIGS. 2 and 3, the sections 8a of the copper layer 8 formed on the first side 3a of the substrate 3 are electrically connected to one another via contact elements in the form of, e.g., bonding connections 15.

According to FIG. 2, so-called gate drives 16 are located on the printed circuit board 19, which actuate the semiconductor switching elements 4 by means of the gate control. The gate drives 16 can actuate the semiconductor switching elements 4 via the signal lines 10.

It can be derived from FIG. 2 that first signal lines 10 for a first semiconductor switching element 4 are located between the phase connections 9c and the positive connections 9a, at a distance thereto, seen in the direction they pass through the casting compound 12, wherein second signal connections 10 for a second semiconductor switching element 4 are located between the positive connections 9a and the negative connections 9b, at a distance thereto, seen from the direction they pass through the casting compound 12.

As explained above, the casting compound 12 is located on the first side 3a of the substrate 3, and encompasses both the substrate 3 and the semiconductor switching elements 4 on the first side 3a. The power connections 9 and signal connections 10 extend outward through the casting compound 12.

The casting compound 12 does not cover the copper layer 7 on the other side 3b of the substrate 3. The half bridge module 1 is then bonded to the separate cooling unit 2, shown in FIGS. 1 and 4, on this second side 3b, e.g. via a sinter layer 17. The cooling unit 2 is preferably a water-based cooler. FIG. 4 shows a strongly schematic illustration of water flowing through a channel 18 in the cooling unit 2.

The half bridge module 1 has, by way of example, two semiconductor switching elements 4, two positive connections 9a, two negative connections 9b, and two phase connections 9c, thus forming a total of six power connections. All of the power connections 9 and signal connections 10 are located within the base area spanning the substrate 3, seen from the direction they pass through the casting compound 12. It is therefore possible to position numerous half bridge modules 1 next to one another in a space saving manner, without it being necessary to provide an empty space for power connections and signal connections between adjacent bridge modules 1.

The half bridge module 1 according to the invention is distinguished by its compact structure and very low inductances. It combines the advantages of discrete switches with the advantages of highly integrated bridge modules. The half bridge module 1 according to the invention can be scaled, and can be easily installed in a power electronics unit.

Figure 5:
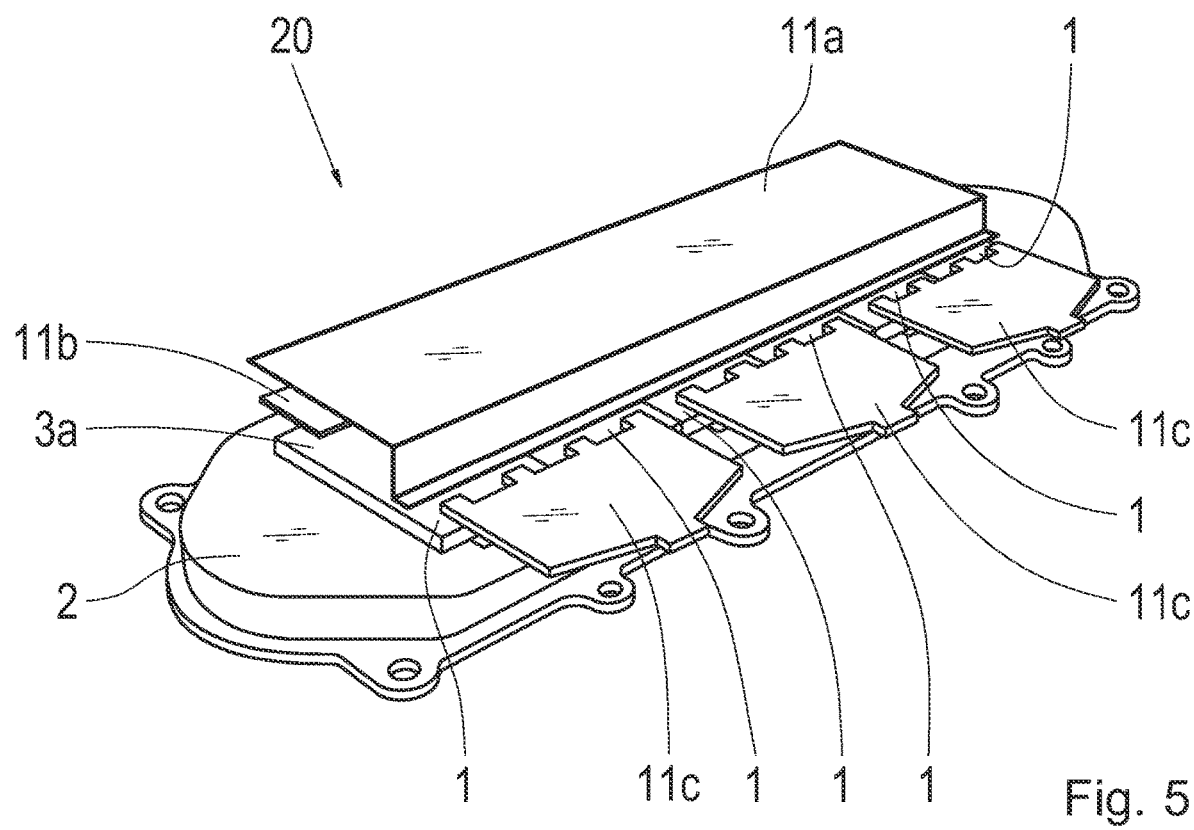
FIG. 5 shows, by way of example and schematically, a possible embodiment of a traction inverter according to the invention.

FIG. 5 shows, by way of example and schematically, one possible embodiment of a traction inverter 20 according to the invention for a power electronics unit in an electric or hybrid vehicle. The traction inverter 20 comprises, e.g., six half bridge modules 1 according to the invention, wherein each of the phase connections 9c in two half bridge modules 1 are in contact via a common third busbar 11c. The positive connections 9a and the negative connections 9b for all six half bridge modules 1 are in contact via a common first busbar 11a, or a common second busbar 11b. As can be seen, all of the connections 9a, 9b, and 9c are located on the first side 3a of the substrate 3. The half bridge modules 1 are attached by means of a sinter layer, not shown in FIG. 5, to a cooling unit 2 in the form of a water-based cooler.

REFERENCE SYMBOLS 1 half bridge module
2 cooling unit
3 substrate
3a first side
3b second side
4 semiconductor switching element
5 semiconductor module
6 carrier plate
7 copper layer
8 copper layer
8a section
9 power connection
9a positive connection
9b negative connection
9c phase connection
10 signal connection
11 busbar
11a first busbar
11b second busbar
11c third busbar
12 casting compound
13 edge
14 insulation
15 bond
16 gate driver
17 sinter layer
18 channel
19 printed circuit board
20 traction inverter

The invention claimed is:

1. A half bridge module for a traction inverter in a power electronics unit of an electric or hybrid vehicle, comprising:
a substrate,
semiconductor switching elements on a first side of the substrate;
power connections configured to connect to power lines that conduct electrical traction energy;
signal connections configured to connect to signal lines for switching the semiconductor switching elements; and
a casting compound, which encompasses the substrate and the semiconductor switching elements on the first side of the substrate,
wherein the power connections and the signal connections are accessed from the first side of the substrate, such that the power connections and the signal connections extend through the casting compound, seen from the first side of the substrate, and are located within a base area spanning the substrate, seen from the direction the power connections and the signal connections pass through the casting compound.

2. The half bridge module according to claim 1, wherein the power connections comprise positive connections, negative connections, and phase connections, wherein the phase connections are adjacent to a first edge of the substrate, seen from the direction the phase connections pass through the casting compound, and the negative connections are adjacent to a second edge of the substrate lying opposite the first edge, seen from the direction the negative connections pass through the casting compound, wherein the positive connections are located between the phase connections and the negative connections, at a distance thereto, seen from the direction the positive connections pass through the casting compound.

3. The half bridge module according to claim 1, wherein positive connections are in contact with a first busbar, and negative connections are in contact with a second busbar, which first busbar and second busbar run one above the another.

4. The half bridge module according to claim 3, wherein the first busbar and the second busbar extend outward, over the second edge of the substrate.

5. The half bridge module according to claim 3, wherein insulation is located between the first busbar and the second busbar.

6. The half bridge module according to claim 3, wherein at least one of the first busbar or the second busbar are coated in plastic.

7. The half bridge module according to claim 1, wherein the power connections comprise positive connections, negative connections, and phase connections, wherein the phase connections are in contact with a third busbar, which extends outward, over the first edge of the substrate.

8. The half bridge module according to claim 1, wherein the power connections comprise positive connections, negative connections, and phase connections, wherein first signal connections for a first semiconductor switching element of the semiconductor switching elements are located between the phase connections and the positive connections, at a distance thereto, seen in the direction the phase connections and the positive connections pass through the casting compound, and wherein second signal connections for a second semiconductor switching element of the semiconductor switching elements are located between the positive connections and the negative connections, at a distance thereto, seen in the direction the positive connections and the negative connections pass through the casting compound.

9. The half bridge module according to claim 8, wherein the first signal connections and the second signal connections are in contact with a printed circuit board.

10. The half bridge module according to claim 1, wherein the casting compound encompassing the substrate and the semiconductor switching elements on the first side of the substrate leaves at least part of a second side of the substrate exposed, wherein the half bridge module is connected to a separate cooling unit on the second side of the substrate.

11. The half bridge module according to claim 10, wherein the cooling unit is bonded to the half bridge module, wherein the bond is at least one of a sinter, solder, or thermal adhesive connection.

12. A traction inverter for a power electronics unit in an electric or hybrid vehicle, comprising at least three half bridge modules according to claim 1.

* * * * *